(12) United States Patent
Byun et al.

(10) Patent No.: US 8,618,421 B2
(45) Date of Patent: Dec. 31, 2013

(54) ELECTRONICS COMPONENT EMBEDDED PCB

(75) Inventors: Jung-Soo Byun, Anyang-si (KR);
Yul-Kyo Chung, Yongin-si (KR);
Hwa-Sun Park, Suwon-si (KR);
Kyung-Min Lee, Daejeon (KR); Mike Kim, Daejeon (KR); Doo-hwan Lee, Euijungboo-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 313 days.

(21) Appl. No.: 12/915,707

(22) Filed: Oct. 29, 2010

(65) Prior Publication Data
US 2011/0100689 A1    May 5, 2011

(30) Foreign Application Priority Data

Oct. 29, 2009 (KR) ......................... 10-2009-0103766

(51) Int. Cl.
*H05K 1/16* (2006.01)

(52) U.S. Cl.
USPC .......................................... 174/260; 361/761

(58) Field of Classification Search
USPC ........................... 174/252, 260; 361/761–764
See application file for complete search history.

(56) References Cited

U.S. PATENT DOCUMENTS

| | | | |
|---|---|---|---|
| 7,420,128 B2 * | 9/2008 | Sunohara et al. | 174/260 |
| 2008/0224271 A1 | 9/2008 | Sogawa et al. | |

FOREIGN PATENT DOCUMENTS

| | | |
|---|---|---|
| JP | 2001-044641 | 2/2001 |
| JP | 2001-044641 A | 2/2001 |
| JP | 2001-313350 A | 11/2001 |
| JP | 2007-088009 | 4/2007 |
| JP | 2007-294984 | 11/2007 |
| JP | 2009-231725 | 10/2009 |
| KR | 10-2006-0043810 | 5/2006 |
| KR | 10-2006-0049008 | 5/2006 |
| TW | 2006-10107 A | 3/2006 |
| WO | WO 2006/070652 | 7/2006 |

OTHER PUBLICATIONS

English translation of the Taiwanese Office Action issued in Taiwan Patent Application No. 201010277421.0 dated Jun. 19, 2012.
Japanese Office Action, and partial English translation thereof, issued in Japanese Patent Application No. 2010-174591 dated Apr. 17, 2012.
Korean Office Action, with partial English translation, issued in Korean Patent Application No. 10-2009-0103766, mailed Mar. 17, 2011.
Office Action issued in Chinese Patent Application No. 201010277421.0 dated Feb. 4, 2013.
Office Action issued in Taiwanese Patent Application No. 099124562 dated Feb. 26, 2013.

* cited by examiner

*Primary Examiner* — Jeremy Norris
(74) *Attorney, Agent, or Firm* — McDermott Will & Emery LLP

(57) ABSTRACT

An electronic component embedded printed circuit board is disclosed. In accordance with an embodiment of the present invention, the electronic component embedded printed circuit board is a printed circuit board in which an electronic component is embedded in a core board, and the electronic component includes a silicon layer and a passivation layer, which is formed on one surface of the silicon layer. Here, a center line of the silicon layer and a center line of the core board are placed on a same line.

3 Claims, 2 Drawing Sheets

ELECTRONICS COMPONENT EMBEDDED PCB

CROSS-REFERENCE TO RELATED APPLICATIONS

This application claims the benefit of Korean Patent Application No. 10-2009-0103766, filed with the Korean Intellectual Property Office on Oct. 29, 2009, the disclosure of which is incorporated herein by reference in its entirety.

BACKGROUND

1. Technical Field

The present invention is related to an electronic component embedded printed circuit board.

2. Description of the Related Art

As part of the next generation versatile compact package technology, the development of electronic component embedded printed circuit boards is recently receiving attention. The electronic component embedded printed circuit board also includes a high functional aspect, in addition to the advantages of versatility and compactness. This is because it can provide a solution to improve the reliability problem that may occur in the electrical connection between electronic components using wire bonding or soldering that is used in a flip chip or ball grid array (BGA) substrate.

In the conventional electronic component, e.g., an IC, embedding method, a structure in which an electronic component is embedded in one side of a core board or build-up layer is employed, and this forms an asymmetric structure, which is vulnerable to warpage under thermal stresses. It is also impossible to embed an electronic component having a certain thickness or less because the warpage of a board occurs in a direction in which the electronic component is embedded under thermal stresses. Moreover, since a stacking material that is used for printed circuit boards can not be manufactured to be thinner than a certain thickness because of electrical insulation, a critical thickness for preventing the warpage is essentially limited due to the properties of the material.

In a conventional printed circuit board, since the locations and thicknesses of electronic components embedded therein are asymmetric with respect to the entire thickness or shape, it is under repeated thermal stresses, particularly thermal stresses in a process, such as soldering, performed at temperatures above 200° C., and thus there is a chance of warpage. Due to the warpage effect, an electronic component generally has to be maintained to a certain thickness or greater, and thus the entire electronic component embedded printed circuit board becomes inevitably thicker.

SUMMARY

The present invention provides an electronic component embedded printed circuit board and a manufacturing method thereof, in which the printed circuit board is formed in a symmetrical structure considering the coefficients of thermal expansion in order to minimize the warpage that is caused by mounting an electronic component while making the printed circuit board thinner.

An aspect of the present invention provides an electronic component embedded printed circuit board having an electronic component embedded in a core board. In accordance with an embodiment of the present invention, the electronic component includes a silicon layer, and a passivation layer, which is formed on one surface of the silicon layer. Here, a center line of the silicon layer and a center line of the core board are placed on a same line.

A reinforcement layer can be stacked on the other surface of the silicon layer. Here, a resin layer can be stacked on the core board, and the reinforcement layer can have the same coefficient of thermal expansion as that of the resin layer.

Meanwhile, the reinforcement layer can be made of the same material as that of the passivation layer.

Additional aspects and advantages of the present invention will be set forth in part in the description which follows, and in part will be obvious from the description, or may be learned by practice of the invention.

DETAILED DESCRIPTION

Figure 1:
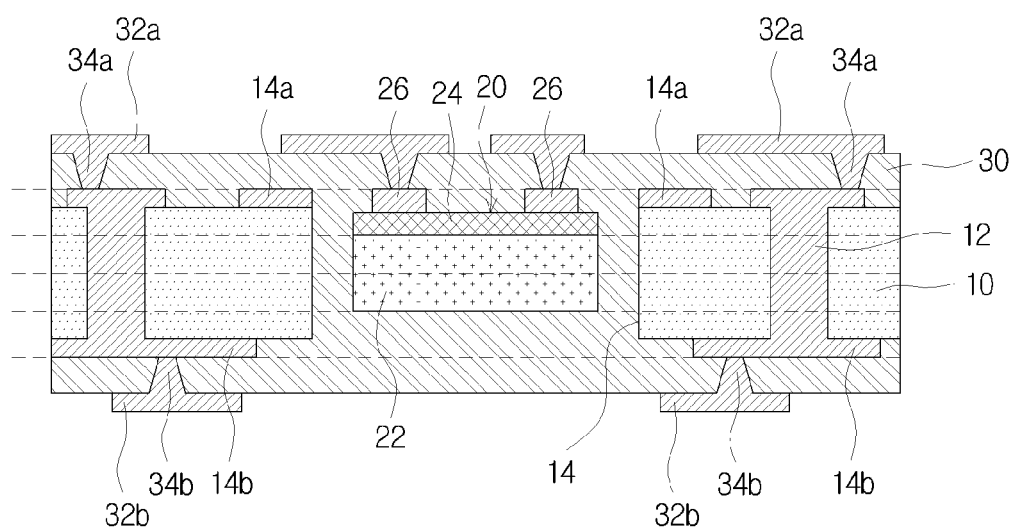
FIG. 1 is a cross-sectional view of an electronic component embedded printed circuit board in accordance with an embodiment of the present invention.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

An electronic component embedded printed circuit board according to certain embodiments of the present invention will be described below in more detail with reference to the accompanying drawings. Those components that are the same or are in correspondence are rendered the same reference numeral regardless of the figure number, and redundant descriptions are omitted.

As an electronic component embedded in a printed circuit board becomes thinner, the warpage of the printed circuit board is expected to be increased so that it becomes almost impossible to reduce the overall thickness of the printed circuit board. To solve this problem, the warpage effect has to be minimized by giving geometrical symmetry that is formed by positioning the electronic component in the center of an insulation layer of the board.

In one example, studies are underway to find a method of aligning the center of the electronic component being embedded and the center of the printed circuit board. In this method, however, an electronic component 20 itself is constituted by a silicon layer 22, a passivation layer 24 and an electrolyte 26, which are placed on an upper surface of the silicon layer 22, so that the electronic component 20 itself forms an asymmetric structure, and particularly, the coefficient of thermal expansion of the silicon layer 22 is different from those of the other parts. Thus, in terms of the coefficient of thermal expansion, the electronic component 20 and a core board 10 are asymmetrically disposed. As a result, this may not properly prevent the warpage effect from occurring.

The present embodiment of the invention provides an electronic component embedded printed circuit board 100, in which the electronic component 20 including the silicon layer 22 and the passivation layer 24 is embedded, that has the center line of the silicon layer 22 placed on a same line as the center line of the core board 10, as illustrated in FIG. 1. That is, a structure closer to an ideal symmetric structure can be obtained by aligning the center line of the silicon layer 22, which functions as the most important factor in the occurrence of warpage, with the center line of the core board 10, more specifically, with the center line of an insulator of the core board 10, considering the coefficient of thermal expansion.

It is to be noted here that the term "same" does not necessarily mean a precisely same dimensional thickness in the mathematical sense but means a substantially same thickness, considering design errors, manufacturing errors, measurement errors and the like. It shall be therefore appreciated hereinafter that the term "same" used in the description means "substantially same," as described above.

A resin layer 30 is stacked on upper and lower surfaces of the core board 10 in which the electronic component 20 is embedded, and then circuit patterns 32a and 32b are formed on the surface of the resin layer 30. The resin layer 30 stacked on the upper and lower surfaces of the core board 10 is injected into a cavity 14, thereby filling the space between the electronic component 20 and an inner wall of the cavity 14.

Here, the circuit patterns 32a and 32b formed on the surface of the resin layer 30 are electrically connected to circuit patterns 14a and 14b formed on the surface of the core board 10 through vias 34a and 34b, and the circuit patterns 14a and 14b formed on the upper and lower surfaces of the core board 10 can be connected to each other by a penetration via 12 that penetrates through the core board 10.

Figure 2:
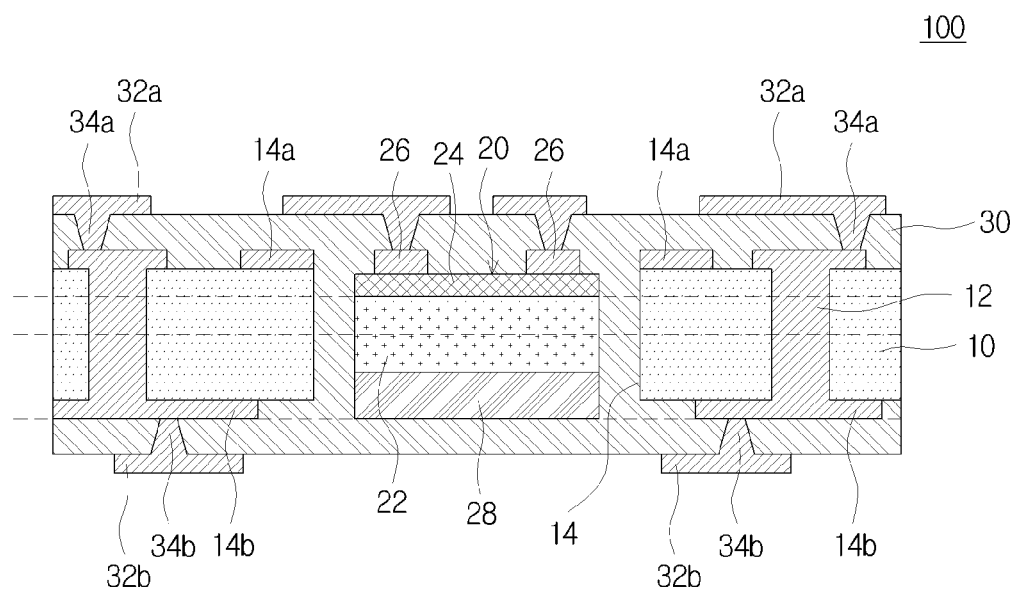
FIG. 2 is a cross-sectional view of an electronic component embedded printed circuit board in accordance with another embodiment of the present invention.

FIG. 2 is a cross-sectional view of an electronic component embedded printed circuit board in accordance with another embodiment of the present invention. Compared to the previously described embodiment of the present invention, an electronic component embedded printed circuit board in accordance with the present embodiment is different in that a reinforcement layer 28 is stacked on a rear surface of an electronic component 20. That is, the electronic component 20 additionally having the reinforcement layer 28 on a rear surface thereof is used. Using the electronic component 20 equipped with the reinforcement layer 28 on the rear surface can facilitate structural symmetry between the electronic component 20 and the core board 10. As illustrated in FIG. 2, the electronic component 20 including the reinforcement layer 28 has the same thickness as that of the core board 10 including the circuit patterns 14a and 14b.

Here, a material that has a coefficient of thermal expansion that is different from that of the silicon layer 22 and a coefficient of thermal expansion that is same as or similar to that of the resin layer 30 can be used as the reinforcement layer 28.

Furthermore, after the rear surface of the silicon layer 22 of the electronic component 20 is lapped to a required level, an additional passivation layer can be formed on the rear surface of the silicon layer 22 by using the same material as that of the passivation layer 24 formed on the front surface, and the additional passivation layer can be used as the reinforcement layer 28. In this case, the electronic component 20 itself can have vertical symmetry so that it can be closer to an ideal symmetric structure for improving the warpage.

In the previously described embodiments of the present invention, it becomes possible to fundamentally improve the warpage by aligning the center line of the silicon layer 22, which causes the warpage particularly due to the difference in coefficient of thermal expansion, with the center line of the core board 10. Moreover, by the above effect, it is also possible to embed the electronic component 20 with a large area into the printed circuit board with a small area, which was impossible in the convention method.

Furthermore, since it becomes possible to make the electronic component 20 or the core board 10, which had to be inevitably thick in order to prevent the warpage, relatively thinner, it is expected that a package that uses the electronic component embedded printed circuit board can be also made thinner.

By utilizing certain embodiments of the present invention as set forth above, a symmetrical structure considering the coefficient of thermal expansion can be formed for the electronic component embedded printed circuit board so that the warpage can be reduced even though a thin component is embedded in a thin printed circuit board.

While the spirit of the present invention has been described in detail with reference to particular embodiments, the embodiments are for illustrative purposes only and shall not limit the present invention. It is to be appreciated that those skilled in the art can change or modify the embodiments without departing from the scope and spirit of the present invention.

As such, many embodiments other than those set forth above can be found in the appended claims.

What is claimed is:

1. An electronic component embedded printed circuit board having an electronic component embedded in a core board, the electronic component comprising:
   a silicon layer; and
   a passivation layer formed on one surface of the silicon layer, wherein:
   a reinforcement layer is stacked on the other surface of the silicon layer,
   the electronic component including the reinforcement layer has the same thickness as that of the core board, and
   a center line of the silicon layer and a center line of the core board are placed on a same line.

2. The electronic component embedded printed circuit board of claim 1, further comprising a resin layer stacked on the core board,
   wherein the reinforcement layer has the same coefficient of thermal expansion as that of the resin layer.

3. The electronic component embedded printed circuit board of claim 1, wherein the reinforcement layer is made of the same material as that of the passivation layer.

* * * * *